US011349463B2

(12) United States Patent
Delshadpour et al.

(10) Patent No.: US 11,349,463 B2
(45) Date of Patent: May 31, 2022

(54) WIDEBAND BUFFER WITH DC LEVEL SHIFT AND BANDWIDTH EXTENSION FOR WIRED DATA COMMUNICATION

(71) Applicant: NXP B.V., Eindhoven (NL)

(72) Inventors: Siamak Delshadpour, Phoenix, AZ (US); Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/084,494

(22) Filed: Oct. 29, 2020

(65) Prior Publication Data
US 2022/0140821 A1   May 5, 2022

(51) Int. Cl.
| H03F 3/195 | (2006.01) |
| H03K 5/003 | (2006.01) |
| H04L 12/28 | (2006.01) |
| H04L 25/06 | (2006.01) |
| H04L 12/50 | (2006.01) |
| H03K 5/24 | (2006.01) |

(52) U.S. Cl.
CPC ............ *H03K 5/003* (2013.01); *H03F 3/195* (2013.01); *H03K 5/2436* (2013.01); *H04L 12/2801* (2013.01); *H04L 12/50* (2013.01); *H04L 25/06* (2013.01)

(58) Field of Classification Search
CPC .... H03K 5/003; H03K 5/2472; H03K 5/2445; H03K 5/2436; H03K 5/2481; H03K 17/161; H03K 17/162; H03F 3/195; H03F 3/19; H04L 12/2801; H04L 12/50; H04L 25/06; G11C 7/062
See application file for complete search history.

(56) References Cited

U.S. PATENT DOCUMENTS

| 7,400,196 B2 | 7/2008 | Wyatt |
| 9,735,989 B1 | 8/2017 | Xie et al. |
| 10,447,507 B1 | 10/2019 | Zhang et al. |
| 2006/0145762 A1* | 7/2006 | Leete ................. H03F 3/45183 330/254 |
| 2020/0153395 A1 | 5/2020 | Geng et al. |

OTHER PUBLICATIONS

Covington III, John M.C. et al. "A Cross-Coupled CMOS Negative Capacitor for Wideband Metamaterial Applications", IEEE, 2014, 5 pgs.
U.S. Appl. No. 16/731,785; 15 pages (filed Dec. 31, 2019).

* cited by examiner

*Primary Examiner* — Jung Kim

(57) ABSTRACT

A wideband buffer circuit and a wideband communication circuit that uses the wideband buffer circuit. The wideband buffer circuit includes first and second transistors deployed as a voltage buffer and connected to first and second input terminals, first and second parallel resistor-capacitor pairs connected to the first and second transistors, first and second cross-coupled transistors connected to the first and second parallel resistor-capacitor pairs and connected to first and second output terminals, and first and second current sources connected to the first and second cross-coupled transistors and a fixed voltage. The first transistor, the first parallel resistor-capacitor pair, the first cross-coupled transistor and the first current source are connected in series. The second transistor, the second parallel resistor-capacitor pair, the second cross-coupled transistor and the second current source are connected in series.

20 Claims, 7 Drawing Sheets

WIDEBAND BUFFER WITH DC LEVEL SHIFT AND BANDWIDTH EXTENSION FOR WIRED DATA COMMUNICATION

BACKGROUND

Wired communication refers to the transmission of data over a wire-based communication technology. In general, wired communications are considered to be the most stable of all types of communications services. Wideband wired data communication systems such as universal serial bus (USB), high-definition multimedia interface (HDMI), DisplayPort (DP), Peripheral Component Interconnect Express (PCIe), Thunderbolt, Converged Input Output (CIO, also known as USB4) and any other high-speed communication applications often include stages of processing within their electronic circuitry.

Wideband wired data communications system circuitry can include several stages including modules to equalize, amplify and/or re-drive signals for its data channels. Usually one stage cannot provide enough gain or equalization. In such multi-stage systems, the use of intermediate buffers between each stage may be advantageous. Oftentimes, however, the buffer consumes even more power than the equalizer, amplifier and drivers, which makes a buffer block design more critical in the system, especially for use in low voltage (e.g., ~1.8V) systems. What are needed are improvements in wide bandwidth communication circuitry that reduce the power consumption and lead to more efficiency.

SUMMARY

Embodiments of a wideband buffer circuit and a wideband communication circuit that uses the wideband buffer circuit are disclosed. In an embodiment, the wideband buffer circuit includes first and second transistors deployed as a voltage buffer and connected to first and second input terminals, first and second parallel resistor-capacitor pairs connected to the first and second transistors, first and second cross-coupled transistors connected to the first and second parallel resistor-capacitor pairs and connected to first and second output terminals, and first and second current sources connected to the first and second cross-coupled transistors and a fixed voltage. The first transistor, the first parallel resistor-capacitor pair, the first cross-coupled transistor and the first current source are connected in series. Similarly, the second transistor, the second parallel resistor-capacitor pair, the second cross-coupled transistor and the second current source are connected in series.

In an embodiment, the wideband buffer circuit further includes a capacitor connected to a first node between the first cross-coupled transistor and the first current source and a second node between the second cross-coupled transistor and the second current source.

In an embodiment, the first output terminal is connected to a first node between the first parallel resistor-capacitor pair and the first cross-coupled transistor and the second output terminal is connected to a second node between the second parallel resistor-capacitor pair and the second cross-coupled transistor.

In an embodiment, the first and second transistors are emitter followers.

In an embodiment, the first and second input terminals are connected to bases or gates of the first and second transistors.

In an embodiment, each of the first and second current sources includes a bipolar transistor and a resistor connected in series to ground.

In an embodiment, each of the first and second current sources includes a metal-oxide-semiconductor (MOS) transistor connected to the fixed voltage.

In an embodiment, the wideband buffer circuit further includes a first resistor connected to a supply voltage and the first transistor and a second resistor connected to the supply voltage and the second transistor.

In an embodiment, the wideband buffer circuit further includes a third current source connected to a first node between the first parallel resistor-capacitor pair and the first cross-coupled transistor and to the fixed voltage and a fourth current source connected to a second node between the second parallel resistor-capacitor pair and the second cross-coupled transistor and to the fixed voltage.

In an embodiment, the wideband communication circuit includes a wideband buffer with first and second input terminals to receive input signals and first and second output terminals to transmit output signals, and a continuous-time linear equalizer (CTLE) connected to the first and second output terminals of the wideband buffer to equalize the output signals from the wideband buffer. The wideband buffer includes first and second transistors deployed as a voltage buffer and connected to the first and second input terminals, first and second parallel resistor-capacitor pairs connected to the first and second transistors, first and second cross-coupled transistors connected to the first and second parallel resistor-capacitor pairs and connected to the first and second output terminals, and first and second current sources connected to the first and second cross-coupled transistors and a fixed voltage. The first transistor, the first parallel resistor-capacitor pair, the first cross-coupled transistor and the first current source are connected in series. Similarly, the second transistor, the second parallel resistor-capacitor pair, the second cross-coupled transistor and the second current source are connected in series.

In an embodiment, the wideband buffer further includes a capacitor connected to a first node between the first cross-coupled transistor and the first current source and a second node between the second cross-coupled transistor and the second current source.

In an embodiment, the first output terminal of the wideband buffer is connected to a first node between the first parallel resistor-capacitor pair and the first cross-coupled transistor and the second output terminal of the wideband buffer is connected to a second node between the second parallel resistor-capacitor pair and the second cross-coupled transistor.

In an embodiment, the first and second input terminals of the wideband buffer are connected to bases or gates of the first and second transistors.

In an embodiment, the wideband buffer further comprises a first resistor connected to a supply voltage and the first transistor and a second resistor connected to the supply voltage and the second transistor.

In an embodiment, the wideband buffer further comprises a third current source connected to a first node between the first parallel resistor-capacitor pair and the first cross-coupled transistor and to the fixed voltage and a fourth current source connected to a second node between the second parallel resistor-capacitor pair and the second cross-coupled transistor and to the fixed voltage.

In an embodiment, the wideband communication circuit further includes a transmitter driver connected to the CTLE, wherein the wideband communication circuit is a redriver.

In an embodiment, the wideband buffer circuit includes first and second transistors deployed as a voltage buffer and connected to first and second input terminals, first and second parallel resistor-capacitor pairs connected to the first and second transistors, wherein resistors of the first and second parallel resistor-capacitor pairs provide signal paths for low frequency signals and wherein capacitors of the first and second parallel resistor-capacitor pairs provide signal paths for high frequency signals, first and second cross-coupled transistors connected to the first and second parallel resistor-capacitor pairs and connected to first and second output terminals, another capacitor connected to the first and second cross-coupled transistors and the first current source, wherein the another capacitor and the first and second cross-coupled transistors provide negative capacitance for bandwidth expansion, and first and second current sources connected to the first and second cross-coupled transistors and a fixed voltage. The first transistor, the first parallel resistor-capacitor pair, the first cross-coupled transistor and the first current source are connected in series. Similarly, the second transistor, the second parallel resistor-capacitor pair, the second cross-coupled transistor and the second current source are connected in series.

In an embodiment, the first output terminal is connected to a first node between the first parallel resistor-capacitor pair and the first cross-coupled transistor and the second output terminal is connected to a second node between the second parallel resistor-capacitor pair and the second cross-coupled transistor.

In an embodiment, the wideband buffer circuit further includes a first resistor connected to a supply voltage and the first transistor and a second resistor connected to the supply voltage and the second transistor, wherein the first and second resistors provide protection from electrostatic discharge (ESD) events.

In an embodiment, the wideband buffer circuit further includes a third current source connected to a first node between the first parallel resistor-capacitor pair and the first cross-coupled transistor and to the fixed voltage and a fourth current source connected to a second node between the second parallel resistor-capacitor pair and the second cross-coupled transistor and to the fixed voltage, wherein the third and fourth current sources are configured to adjust DC values of output signals on the first and second output terminals.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended Figs. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
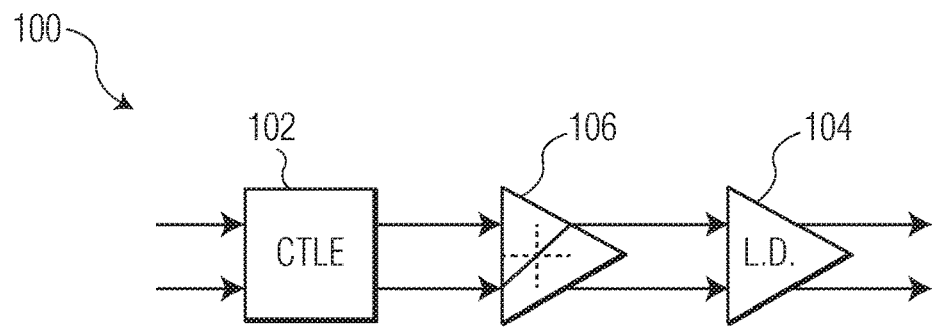
FIG. 1 is a block diagram of a linear redriver in accordance with prior art.

FIG. 1 illustrates a typical architecture of a linear redriver 100 in accordance with prior art. The linear redriver 100 includes a continuous-time linear equalizer (CTLE) 102 to equalize input signals and a linear transmitter (TX) line driver 104 to retransmit the signals based on signal standard specifications. Due to gain variation over PVT (process, voltage and temperature) and significant parasitic loadings from the transmitter (not shown in FIG. 1), a gain stage 106 may be needed between the CTLE 102 and the TX line driver 104. The gain stage 106 can be a programmable gain amplifier (PGA) or an automatic gain control (AGC) stage. Depending on the design, the programmable gain stage can stay or be eliminated.

Figure 2:
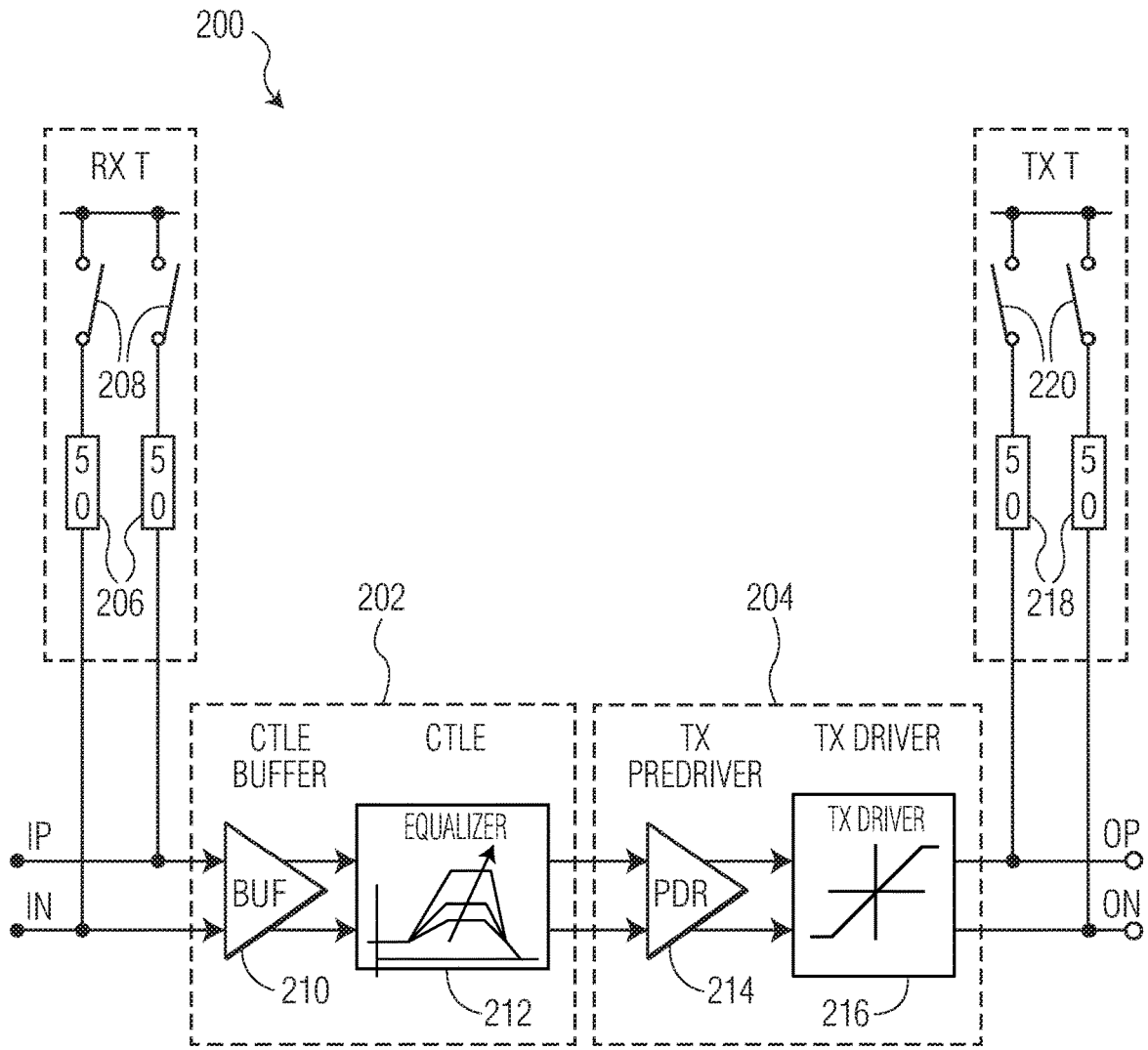
FIG. 2 is a block diagram of a wideband communication circuit in the form of a linear redriver without the need of a gain stage in which embodiments of the invention may be implemented.

Turning now to FIG. 2, a wideband wired communication circuit in the form of a linear redriver 200 without the need of a gain stage in which embodiments of the invention may be implemented is illustrated. As shown in FIG. 2, the linear redriver 200, which can be used in, for example, USB/HDMI/DP/Thunderbolt/PCIe/CIO data communication paths, includes an equalization block 202 that receives input signals at input terminals IP and IN and a transmission block 204 that outputs signal at output terminals OP and ON. The equalization block 202 includes a CTLE 212, while the transmission block 204 includes a TX driver 216. The TX driver 216 operates to drive a termination load disposed at a TX driver output. Output from the TX driver 216 typically drives 50-Ohm load terminations 218 at its outputs, which are each connected to a switch 220. The 50-Ohm load terminations 218 and the associated switches 220 are shown as a Transmit Termination (TXT) within the dashed box positioned after the transmission block 204. Similar 50-Ohm loads 206 can also be found to affect the inputs of the equalization block 202, which are also each connected to a switch 208. The 50-Ohm termination resistors 206 and the associated switches 208 are shown as a Receive Termination (RXT) within the dashed box positioned before the equalization block 202. A CTLE buffer 210 (BUF), which is designed in accordance with embodiments of the invention, can be disposed inline before the CTLE 212 to isolate the CTLE from the inputs and set a certain direct current (DC) level for the CTLE. A TX pre-driver 214 (PDR) can be disposed inline after the CTLE 212 and before the TX driver 216. A buffer circuit described herein in accordance with embodiments of the invention may be used as the CTLE buffer 210 and/or the TX pre-driver buffer 214.

The TX driver 216 can be provided as a simple differential pair to drive what is typically a 50-Ohm termination (see FIG. 2, 50-Ohm load terminations 218 or 50-Ohm load of the next stage). But this can call for the differential pair transistors to be relatively large devices. Furthermore, parasitic capacitors of the TX driver 216 and routing may load the CTLE 212 and impact its performance. As a result, the TX pre-driver buffer 214 may be needed to isolate the CTLE 212 from the TX driver 216 and drive the long routing path from the CTLE to the TX driver. The TX pre-driver buffer 214 may also provide the right or desired DC level for the TX driver inputs.

The redriver 200 is illustrated using 50-Ohm terminations 206 to supply as the input terminations. Thus, any circuit required for the redriver 200 needs to work with higher DC level. In the case of termination to ground, the circuit needs to work with lower DC levels.

Figure 3:
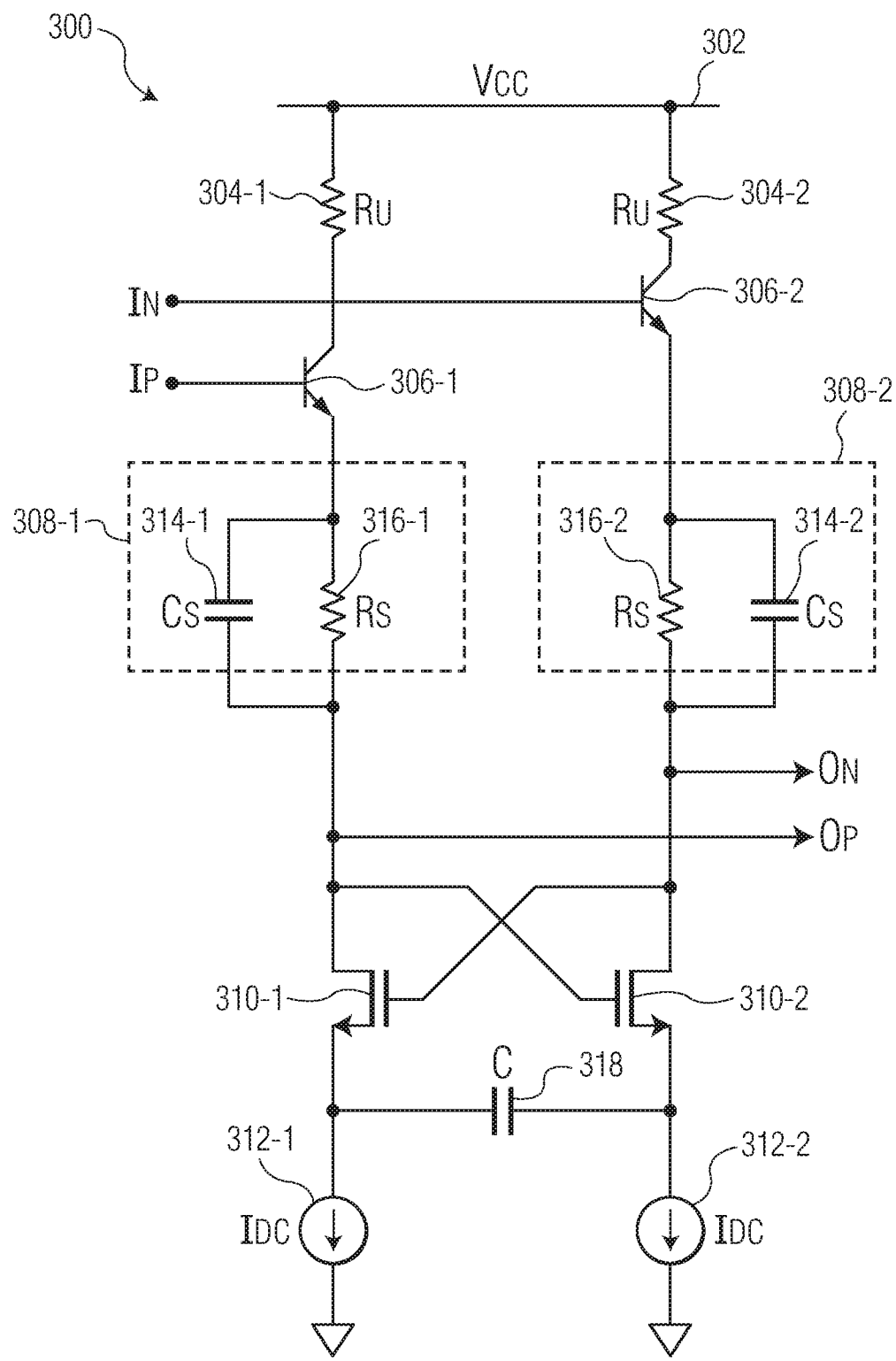
FIG. 3 is a circuit diagram of a wideband buffer circuit in bipolar form in accordance with embodiments of the invention.

Turning now to FIG. 3, a wideband buffer circuit 300 in bipolar form in accordance with embodiments of the invention is illustrated. The architecture of this wideband buffer circuit 300 can be used to provide the signal buffering and level shifting functions desirable for wideband communications systems, including those depending on low voltage systems. It can also be used to boost the high frequency gain of a communications circuit to expand the bandwidth (BW) of signals. It can be used to fulfill the predriver and redriver requirements, as described with respect to FIG. 2. Using bipolar transistors, which can also be provided in bipolar complementary metal-oxide-semiconductor (BiCMOS) technology, the input stage typically needs a certain DC level (e.g., set at the DC common mode voltage level, or needed by design, "desired level"). To achieve this, use of a buffer before CTLE 210, as shown in FIG. 2, is desirable to isolate incoming signals from inputs of the CTLE 210 and set their DC level.

As shown in FIG. 3, the wideband buffer circuit 300 includes two parallel paths from a supply rail 302, e.g., Vcc, to a fixed voltage, e.g., ground. The first path includes a resistor 304-1 with a resistance value of $R_U$, a first bipolar transistor 306-1, a parallel resistor-capacitor pair 308-1, a second bipolar transistor 310-1 and a current source 312-1. The parallel resistor-capacitor pair 308-1 includes a capacitor 314-1 with a capacitance value of $C_S$ and a resistor 316-1 with a resistance value of $R_S$. Similarly, the second path includes a resistor 304-2 with a resistance value of $R_U$, a first bipolar transistor 306-2, a parallel resistor-capacitor pair 308-2, a second bipolar transistor 310-2 and a current source 312-2. The parallel resistor-capacitor pair 308-2 includes a capacitor 314-2 with a capacitance value of $C_S$ and a resistor 316-2 with a resistance value of $R_S$. The bipolar transistors 310-1 and 310-2 are cross-coupled transistors, where the emitters of these transistors are connected to a capacitor 318 with a capacitance value of C. Thus, the capacitor 318 is connected to a node between the transistor 310-1 and the current source 312-1, and to a node between the transistor 310-2 and the current source 312-2. The wideband buffer circuit 300 includes a pair of input terminals $I_P$ and $I_N$, which are connected to the bases of the transistors 306-1 and 306-2, respectively, and a pair of output terminals $O_P$ and $O_N$, which are connected to the collectors of the transistors 310-1 and 310-2, respectively. The input terminals $I_P$ and $I_N$ and the output terminals $O_P$ and $O_N$ are used to receive and output differential signals.

The pair of bipolar transistors 306-1 and 306-2, which are configured as emitter followers, are the major devices to buffer the input signals on the input terminals $I_P$ and $I_N$. These input transistors act as the main isolator between the inputs and the next stage. The current sources 312-1 and 312-1 provides bias current, which is DC current of IDC, which provide bias current for the wideband communications circuit 300.

The resistors 304-1 and 304-2 help to protect the transistors 306-1 and 306-2 against electrostatic discharge (ESD) events with respect to supply. Each of the resistors 304-1 and 304-2 limits the current between $D_{BC}$ (base-collector Diode) of the connected transistor and the supply during ESD event, while zap is between the base, which may be connected to a pin when using the wideband buffer circuit 300 as a CTLE input buffer, and the supply. This will be a simple solution to protect the transistors 306-1 and 306-2 and removes the need of using large transistors to be self-robust against ESD event, which means smaller devices can be used that work for higher speed. It also avoids the need for a series resistor with each of the bases of the transistors 306-1 and 306-2, which will reduce the BW and is a handicap for high-speed application.

Figure 4:
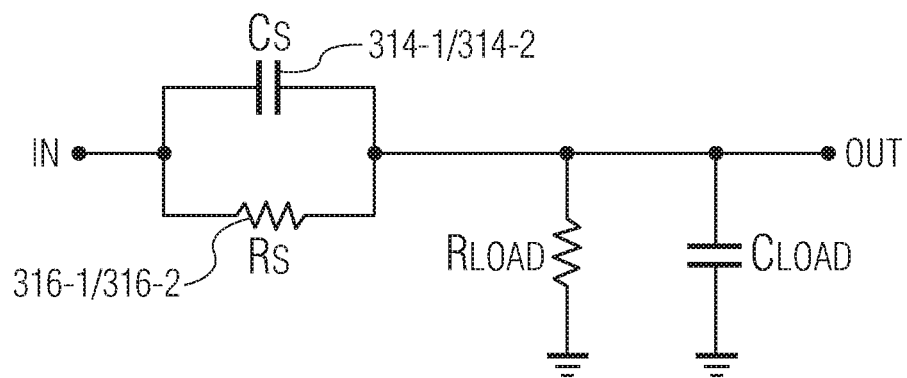
FIG. 4 is a circuit diagram of a passive continuous-time linear equalizer (CTLE) in combination with the capacitance CLOAK and the resistance RLOAD for a load in accordance with embodiments of the invention.

The parallel resistor-capacitor pairs 308-1 and 308-2 shape DC and AC paths from the input terminals $I_P$ and $I_N$ to the output the output terminals $O_P$ and $O_N$. Each of the resistors 316-1 and 316-2 causes a DC shift from the corresponding input to the corresponding output, which can be adjustable by changing the current $I_{DC}$ that is controlled by the corresponding current source 312-1 or 312-2. The DC shift will be: $V_{BE}-R_S*I_{DC}$, where $V_{BE}$ is the voltage across the base and the emitter of the transistor 306-1 or 306-2, $R_S$ is the electrical resistance of each of the resistors 316-1 and 316-2, and $I_{DC}$ is the current supplied by each of the current sources 312-1 and 312-2. Thus, the DC shift can be adjusted with the $R_S$ value (to make it switchable which of course is not recommended in a high-speed application). In addition, making the current $I_{DC}$ programmable is the better solution and will not impact the high-speed performance of the wideband buffer circuit 300 significantly. The DC and low frequency path of signal will be through the resistor 316-1 or 316-2. The high-speed path of signal will be through the capacitor 314-1 and 314-2. Also, it is noted here that "$R_S$ and $C_S$", where $R_S$ is the electrical resistance of each of the resistors 316-1 and 316-2 and $C_S$ is the capacitance of each of the capacitor 314-1 and 314-2, forms a zero in the signal path which acts as a boost for higher frequency which compensates any BW reduction at high frequency. It practically serves as a passive CTLE in combination with the capacitance $C_{LOAD}$ and the resistance $R_{LOAD}$ for the load of the next stage which the wideband buffer circuit 300 is driving (e.g. a CTLE or a TX driver), which is illustrated in FIG. 4. The value of the capacitors 314-1 and 314-2 can be adjusted to shape the zero. It also needs to be aligned with the negative capacitance (explained below) and $C_{LOAD}$.

The cross-coupled transistors 310-1 and 310-2 and the capacitor 318 shape a negative capacitance to help BW expansion. The negative capacitance will partially compensate parasitic capacitances of the wideband buffer circuit 300 itself at the output terminals $O_P$ and $O_N$ and the capacitive loading effect of the next stage ($C_{LOAD}$).

Figure 5:
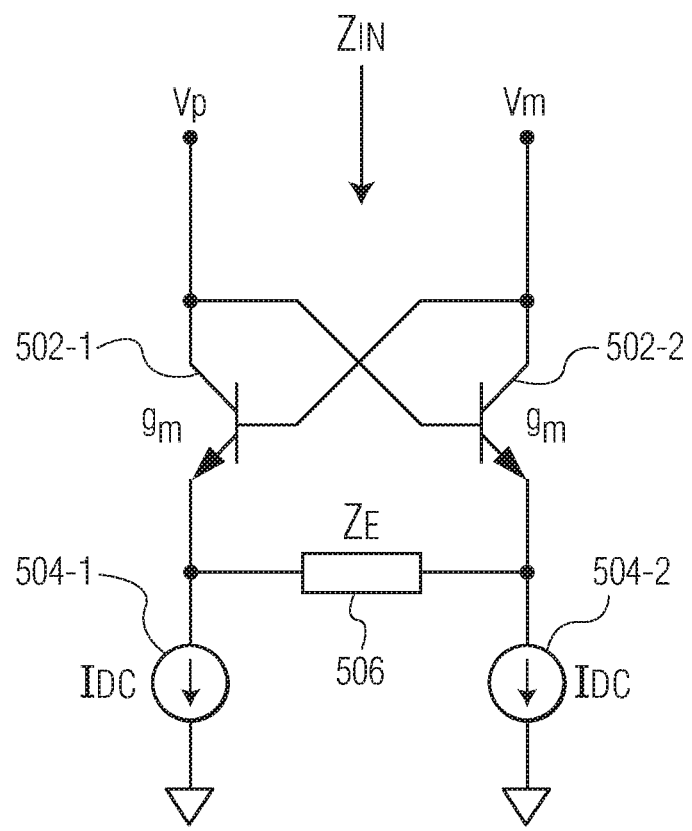
FIG. 5 is a circuit diagram illustrating negative impedance for bandwidth expansion implemented in the wideband buffer circuit in accordance with embodiments of the invention.

Negative capacitance for BW extension, which is implemented in the wideband buffer circuit 300, is now described with reference to FIG. 5, which illustrates a known technique to generate a negative capacitor. In general, it can be shown that using cross-coupled transistors 502-1 and 502-2, which can be bipolar or metal-oxide-semiconductor (MOS) transistors that are provided with voltages $V_p$ and $V_m$, respectively, that are connected to current sources 504-1 and 504-2 and an impedance element 506, as shown in FIG. 5, provides an input impedance of:

$$Z_{IN}=-Z_E-2/g_m,$$

where $Z_E$ is the impedance of an electrical element 506 and $g_m$ is the transconductance of each of the two transistors 502-1 and 502-2. Thus, the input impedance will be approximately equal to the negative impedance of the load, if $Z_E \gg 2/g_m$. As a result, when the electrical element 506 is a capacitor with a capacitance of $C_E$, combination of the transistors 502-1 and 502-2 and the capacitor 506 provide a negative capacitance of $-C_E$. Although this is shown for NPN-bipolar junction transistor (BJT) implementation in FIG. 6, it is valid for the case where the transistors 502-1 and 504-2 are replaced with N-type MOS (NMOS) transistors. Also, the same principals are valid for PNP-BJT or P-type MOS (PMOS) transistor implementation.

Figure 6A:
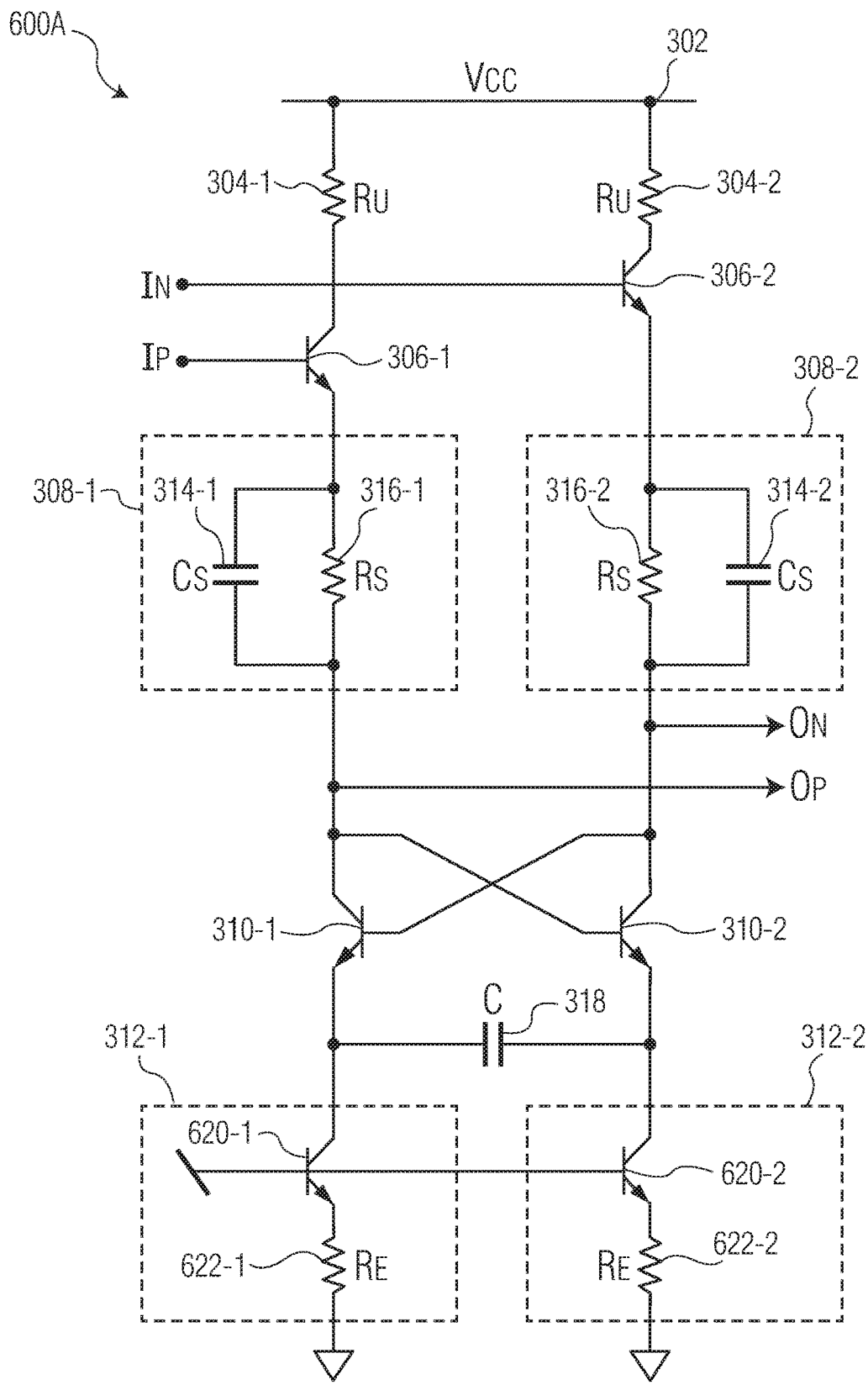
FIG. 6A shows a complete wideband buffer circuit having high-speed buffer and level shifter capabilities in bipolar technology with NPN-bipolar junction transistors (BJTs) in accordance with an embodiment of the invention.

Turning now to FIG. 6A, a complete wideband buffer circuit 600A having high-speed buffer and level shifter capabilities in bipolar technology with NPN BJTs in accordance with an embodiment of the invention is shown. The wideband buffer circuit 600A includes all the elements of the wideband buffer circuit 300 depicted in FIG. 3. However, in FIG. 6A, the components of the current sources 312-1 and 312-2 are also illustrated. As shown in FIG. 6A, the current source 312-1 includes a bipolar transistor 520-1 and a resistor 522-1 with a resistance value of $R_E$, which are connected in series. Similarly, the current source 312-2 includes a bipolar transistor 520-2 and a resistor 522-2 with a resistance value of $R_E$, which are also connected in series. The wideband buffer circuit 600A may be implemented with PNP BJTs for lower common mode voltages at the input terminals $I_P$ and $I_N$.

Figure 6B:
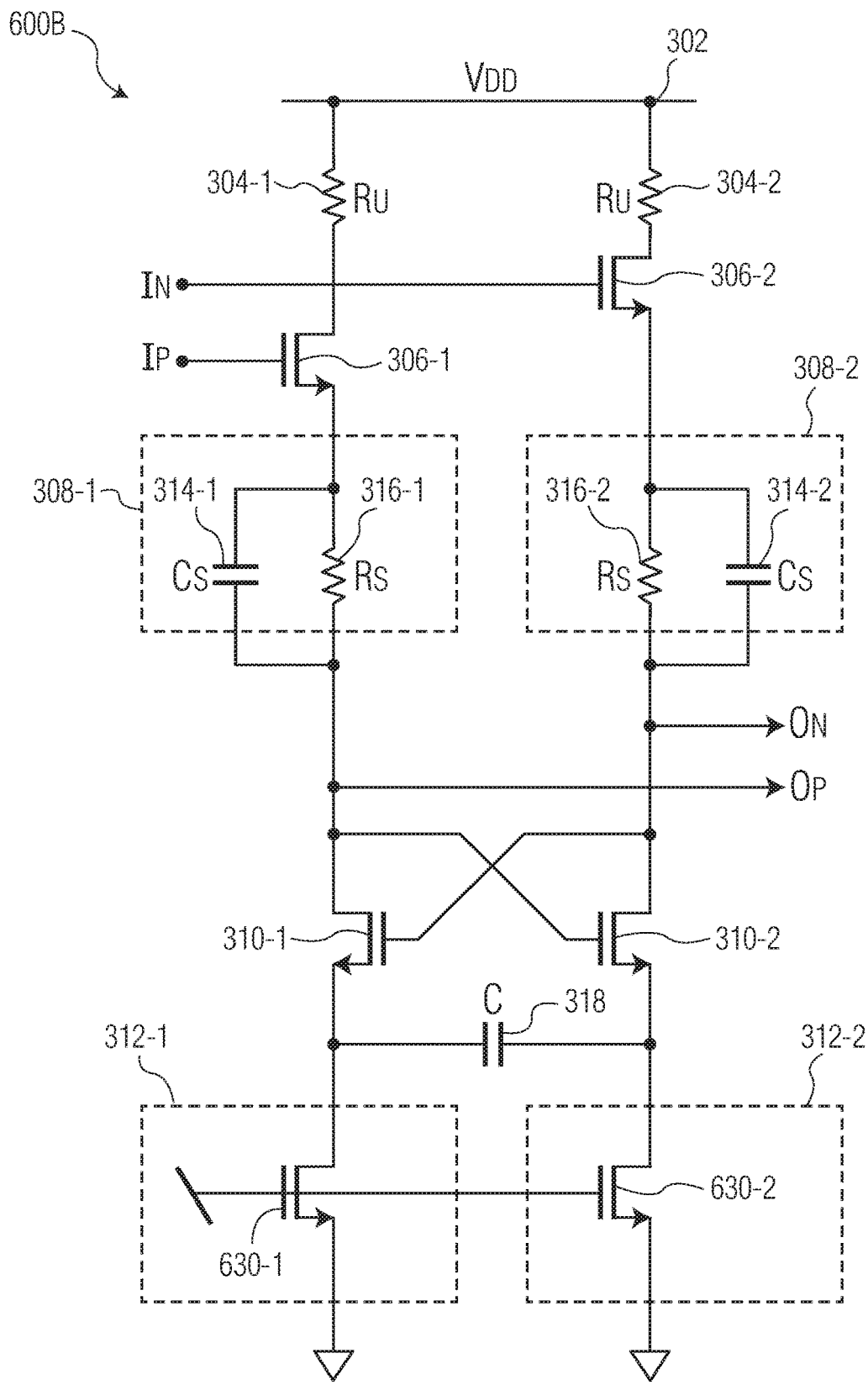
FIG. 6B shows a complete wideband buffer circuit having high-speed buffer and level shifter capabilities in complementary metal-oxide-semiconductor (CMOS) technology with N-type MOS (NMOS) transistors in accordance with an embodiment of the invention.

Turning now to FIG. 6B, a complete wideband buffer circuit 600B having high-speed buffer and level shifter capabilities in complementary metal-oxide-semiconductor (CMOS) technology with NMOS transistors in accordance with an embodiment of the invention is shown. The wideband buffer circuit 600B also includes all the elements of the wideband buffer circuit 300. However, in FIG. 6B, the transistors are NMOS transistors. In addition, in FIG. 6B, the components of the current sources 312-1 and 312-2 are also illustrated. As shown in FIG. 6B, the current source 312-1 includes an NMOS transistor 630-1 and the current source 312-2 includes an NMOS transistor 630-2. The wideband buffer circuit 600B may be implemented with PMOS transistors for lower common mode voltages at the input terminals $I_P$ and $I_N$.

Figure 7:
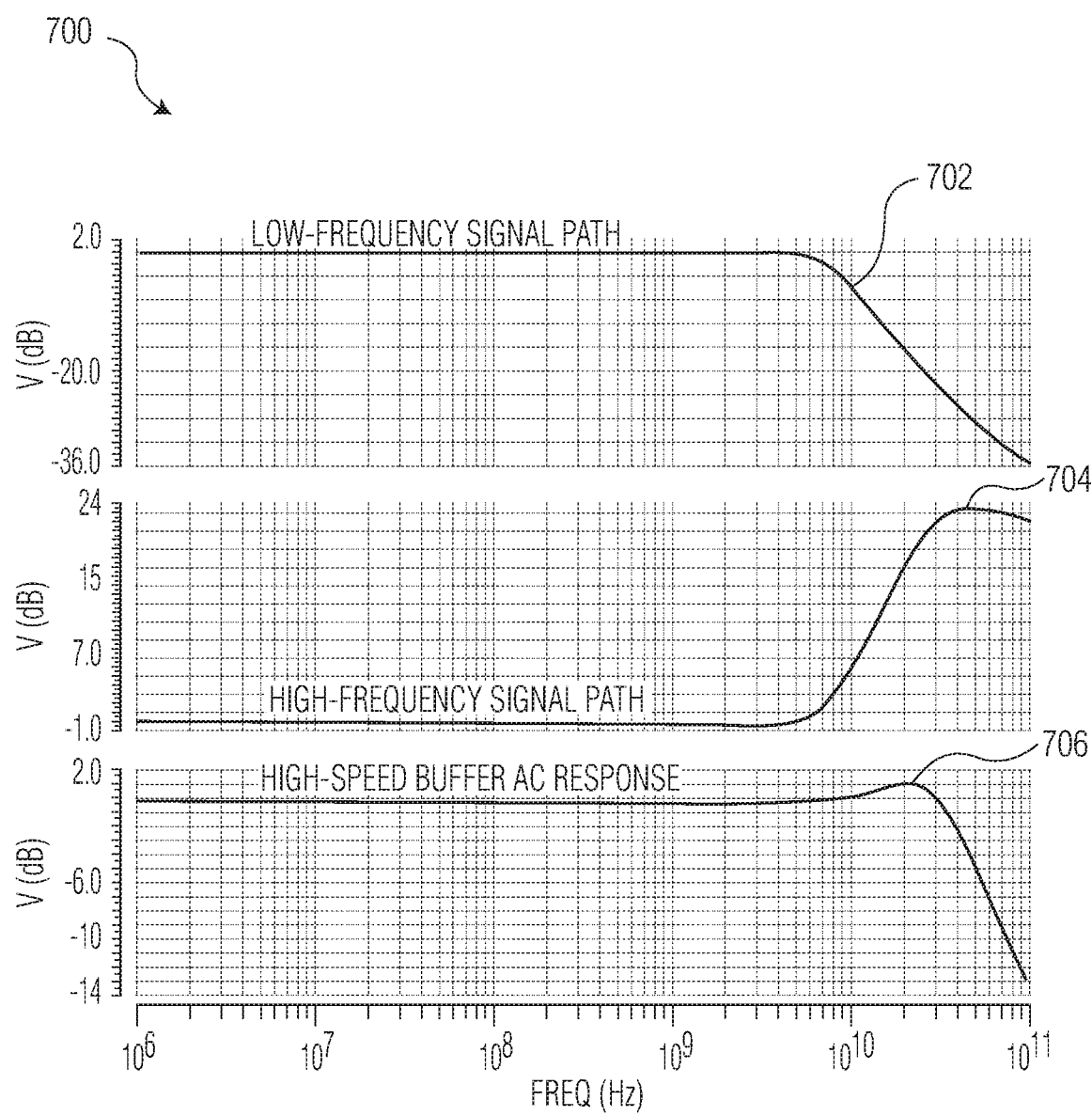
FIG. 7 shows a graph that depicts the alternation current (AC) response of a wideband buffer circuit, such as the wideband buffer circuit shown in FIG. 6A or 6B, with a differential load capacitance of $C_{LOAD}$ in accordance with an embodiment of the invention.

FIG. 7 shows a graph 700 that depicts the alternation current (AC) response of a wideband buffer circuit, such as the wideband buffer circuit 600A or 600B, with a differential load capacitance of $C_{LOAD}$ in accordance with an embodiment of the invention. In the graph 700, the top curve 702 shows the AC response without the capacitor 314-1 or 314-2, which is the DC (and low-frequency) signal path. The middle curve 704 shows the AC response of the buffer circuit with a negligible $R_S$, which is the high-frequency signal path, and as shown in the graph, it generates a zero to boost the high frequency gain, which is expanding the BW. The bottom curve 706 shows the complete buffer response, which has the expanded BW. The right adjustment of $C_S$ and $C_E$ (which generates the negative capacitance) for the $C_{LOAD}$ provides the desired BW of the buffer circuit.

Figure 8:
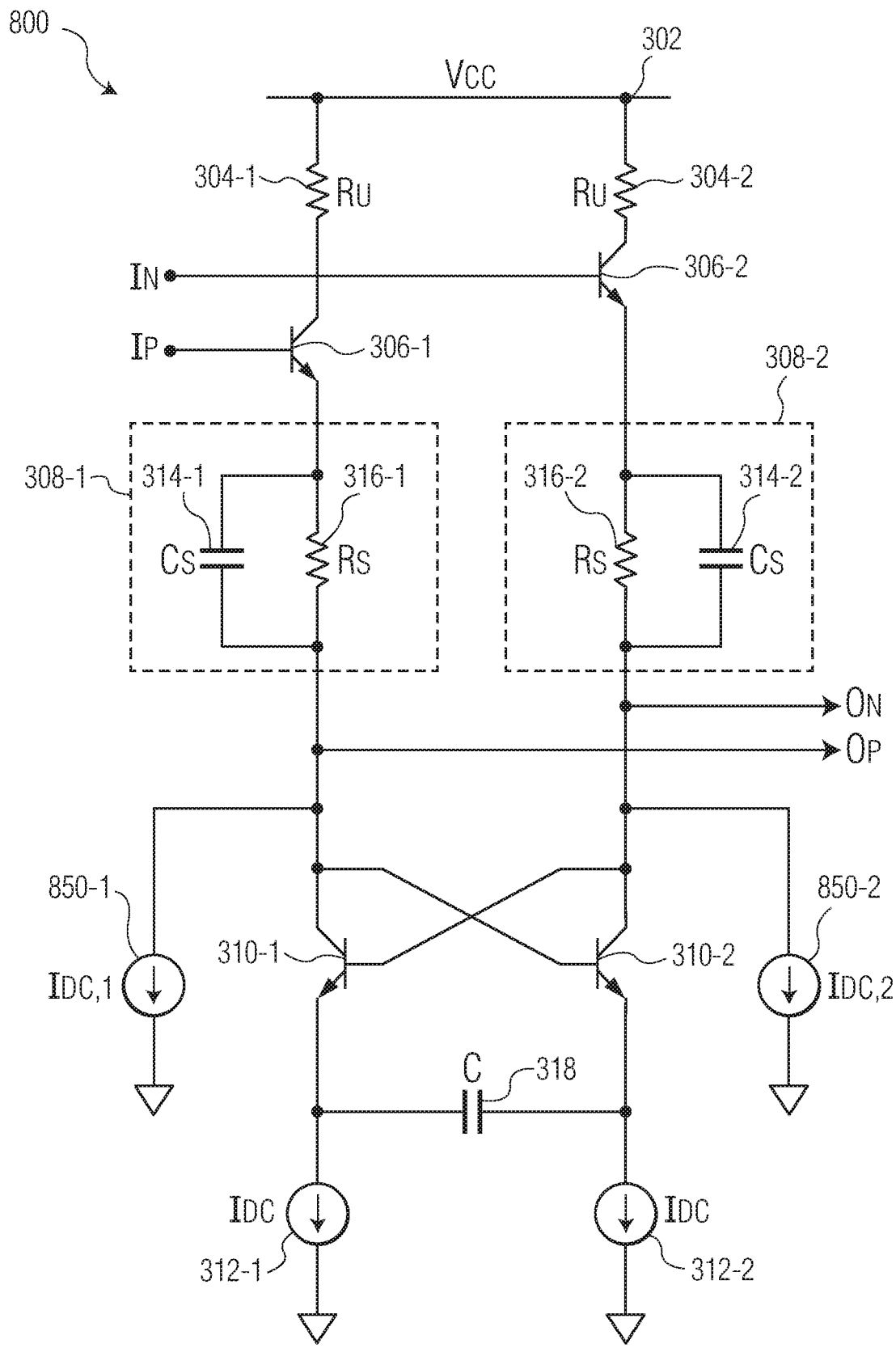
FIG. 8 is a circuit diagram of a wideband buffer circuit that can be used to adjust DC values of output signals in accordance with an embodiment of the invention.

Referring back to FIG. 3, the output DC voltage of the wideband buffer circuit 300 can be adjusted by adjusting the $I_{DC}$ current sources 312-1 and 312-2. However, there are applications where different output DC values may be needed. FIG. 8 shows a wideband buffer circuit 800 in accordance with an embodiment of the invention that can be used to adjust DC values of $Q_P$ and $Q_N$ outputs independently. The wideband buffer circuit 800 includes all the elements of the wideband buffer circuit 300. In addition, the wideband buffer circuit 800 includes a current source 850-1 that is parallel to the current source 312-1, and a current source 850-2 that is parallel to the current source 312-2. The currents $I_{DC1}$ and $I_{DC2}$ supplied by the current sources 850-1 and 850-2 can be adjusted to adjust the DC values of $Q_P$ and $Q_N$ outputs independently.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A wideband buffer circuit comprising:
   first and second transistors deployed as a voltage buffer and connected to first and second input terminals;
   first and second parallel resistor-capacitor pairs connected to the first and second transistors;
   first and second cross-coupled transistors connected to the first and second parallel resistor-capacitor pairs and connected to first and second output terminals; and
   first and second current sources connected to the first and second cross-coupled transistors and a fixed voltage,
   wherein the first transistor, the first parallel resistor-capacitor pair, the first cross-coupled transistor and the first current source are connected in series and wherein the second transistor, the second parallel resistor-capacitor pair, the second cross-coupled transistor and the second current source are connected in series.

2. The wideband buffer circuit of claim 1, further comprising a capacitor connected to a first node between the first cross-coupled transistor and the first current source and a second node between the second cross-coupled transistor and the second current source.

3. The wideband buffer circuit of claim 1, wherein the first output terminal is connected to a first node between the first parallel resistor-capacitor pair and the first cross-coupled transistor and the second output terminal is connected to a second node between the second parallel resistor-capacitor pair and the second cross-coupled transistor.

4. The wideband buffer circuit of claim 1, wherein the first and second transistors are emitter followers.

5. The wideband buffer circuit of claim 1, wherein the first and second input terminals are connected to bases or gates of the first and second transistors.

6. The wideband buffer circuit of claim 1, wherein each of the first and second current sources includes a bipolar transistor and a resistor connected in series to ground.

7. The wideband buffer circuit of claim 1, wherein each of the first and second current sources includes a metal-oxide-semiconductor (MOS) transistor connected to the fixed voltage.

8. The wideband buffer circuit of claim 1, wherein further comprising a first resistor connected to a supply voltage and the first transistor and a second resistor connected to the supply voltage and the second transistor.

9. The wideband buffer circuit of claim 1, further comprising a third current source connected to a first node between the first parallel resistor-capacitor pair and the first cross-coupled transistor and to the fixed voltage and a fourth current source connected to a second node between the second parallel resistor-capacitor pair and the second cross-coupled transistor and to the fixed voltage.

10. A wideband communication circuit comprising:
    a wideband buffer with first and second input terminals to receive input signals and first and second output terminals to transmit output signals; and
    a continuous-time linear equalizer (CTLE) connected to the first and second output terminals of the wideband buffer to equalize the output signals from the wideband buffer,
    wherein the wideband buffer comprises:
        first and second transistors deployed as a voltage buffer and connected to the first and second input terminals;
        first and second parallel resistor-capacitor pairs connected to the first and second transistors;
        first and second cross-coupled transistors connected to the first and second parallel resistor-capacitor pairs and connected to the first and second output terminals; and
        first and second current sources connected to the first and second cross-coupled transistors and a fixed voltage,
        wherein the first transistor, the first parallel resistor-capacitor pair, the first cross-coupled transistor and the first current source are connected in series and wherein the second transistor, the second parallel resistor-capacitor pair, the second cross-coupled transistor and the second current source are connected in series.

11. The wideband communication circuit of claim 10, wherein the wideband buffer further comprises a capacitor connected to a first node between the first cross-coupled transistor and the first current source and a second node between the second cross-coupled transistor and the second current source.

12. The wideband communication circuit of claim 10, wherein the first output terminal of the wideband buffer is connected to a first node between the first parallel resistor-capacitor pair and the first cross-coupled transistor and the second output terminal of the wideband buffer is connected to a second node between the second parallel resistor-capacitor pair and the second cross-coupled transistor.

13. The wideband communication circuit of claim 10, wherein the first and second input terminals of the wideband buffer are connected to bases or gates of the first and second transistors.

14. The wideband communication circuit of claim 10, wherein the wideband buffer further comprises a first resistor connected to a supply voltage and the first transistor and a second resistor connected to the supply voltage and the second transistor.

15. The wideband communication circuit of claim 10, wherein the wideband buffer further comprises a third current source connected to a first node between the first parallel resistor-capacitor pair and the first cross-coupled transistor and to the fixed voltage and a fourth current source connected to a second node between the second parallel resistor-capacitor pair and the second cross-coupled transistor and to the fixed voltage.

16. The wideband communication circuit of claim 10, further comprising a transmitter driver connected to the CTLE, wherein the wideband communication circuit is a redriver.

17. A wideband buffer circuit comprising:
 first and second transistors deployed as a voltage buffer and connected to first and second input terminals;
 first and second parallel resistor-capacitor pairs connected to the first and second transistors, wherein resistors of the first and second parallel resistor-capacitor pairs provide signal paths for low frequency signals and wherein capacitors of the first and second parallel resistor-capacitor pairs provide signal paths for high frequency signals;
 first and second cross-coupled transistors connected to the first and second parallel resistor-capacitor pairs and connected to first and second output terminals;
 another capacitor connected to the first and second cross-coupled transistors and the first current source, wherein the another capacitor and the first and second cross-coupled transistors provide negative capacitance for bandwidth expansion; and
 first and second current sources connected to the first and second cross-coupled transistors and a fixed voltage,
 wherein the first transistor, the first parallel resistor-capacitor pair, the first cross-coupled transistor and the first current source are connected in series and wherein the second transistor, the second parallel resistor-capacitor pair, the second cross-coupled transistor and the second current source are connected in series.

18. The wideband buffer circuit of claim 17, wherein the first output terminal is connected to a first node between the first parallel resistor-capacitor pair and the first cross-coupled transistor and the second output terminal is connected to a second node between the second parallel resistor-capacitor pair and the second cross-coupled transistor.

19. The wideband buffer circuit of claim 17, wherein further comprising a first resistor connected to a supply voltage and the first transistor and a second resistor connected to the supply voltage and the second transistor, wherein the first and second resistors provide protection from electrostatic discharge (ESD) events.

20. The wideband buffer circuit of claim 17, further comprising a third current source connected to a first node between the first parallel resistor-capacitor pair and the first cross-coupled transistor and to the fixed voltage and a fourth current source connected to a second node between the second parallel resistor-capacitor pair and the second cross-coupled transistor and to the fixed voltage, wherein the third and fourth current sources are configured to adjust DC values of output signals on the first and second output terminals.

* * * * *